(12) United States Patent
England et al.

(10) Patent No.: US 10,770,440 B2
(45) Date of Patent: Sep. 8, 2020

(54) MICRO-LED DISPLAY ASSEMBLY

(71) Applicant: GLOBALFOUNDRIES INC., Grand Cayman (KY)

(72) Inventors: Luke England, Saratoga Springs, NY (US); Bartlomiej Jan Pawlak, Leuven (BE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/459,336

(22) Filed: Mar. 15, 2017

(65) Prior Publication Data
US 2018/0269191 A1    Sep. 20, 2018

(51) Int. Cl.
| | | |
|---|---|---|
| *H01L 25/16* | (2006.01) | |
| *H01L 33/62* | (2010.01) | |
| *H01L 25/075* | (2006.01) | |
| *H01L 27/15* | (2006.01) | |
| *H01L 33/32* | (2010.01) | |
| *H01L 27/12* | (2006.01) | |
| *H01L 33/24* | (2010.01) | |
| *H01L 33/18* | (2010.01) | |

(52) U.S. Cl.
CPC ........ *H01L 25/167* (2013.01); *H01L 25/0753* (2013.01); *H01L 27/156* (2013.01); *H01L 27/1214* (2013.01); *H01L 33/18* (2013.01); *H01L 33/24* (2013.01); *H01L 33/32* (2013.01); *H01L 33/62* (2013.01)

(58) Field of Classification Search
CPC ... H01L 33/62; H01L 25/167; H01L 25/0753; H01L 27/156; H01L 33/24
See application file for complete search history.

(56) References Cited

U.S. PATENT DOCUMENTS

| | | |
|---|---|---|
| 5,940,683 A | 8/1999 | Holm et al. |
| 6,657,236 B1 | 12/2003 | Thibeault et al. |
| 7,335,972 B2 | 2/2008 | Chanchani |
| 7,480,426 B1 * | 1/2009 | Dellmann ............ H01L 25/167 257/774 |
| 8,426,227 B1 | 4/2013 | Bibl et al. |

(Continued)

FOREIGN PATENT DOCUMENTS

| | | |
|---|---|---|
| TW | 465130 | 11/2001 |
| TW | I424251 | 1/2014 |

(Continued)

OTHER PUBLICATIONS

Taiwanese Office Action and Search Report in related TW Application No. 106120184, dated Sep. 17, 2018, 12 pages.

(Continued)

*Primary Examiner* — Cuong Q Nguyen
*Assistant Examiner* — Shih Tsun A Chou
(74) *Attorney, Agent, or Firm* — Anthony Canale; Andrew M. Calderon; Roberts Calderon Safran & Cole, P.C.

(57) ABSTRACT

The present disclosure relates to semiconductor structures and, more particularly, to a micro-light emitting diode (LED) display assembly and methods of manufacture. The structure includes an interposer and a plurality of micro-LED arrays each of which include a plurality of through-vias connecting pixels of the plurality of micro-LED arrays to the interposer.

20 Claims, 4 Drawing Sheets

(56) References Cited

U.S. PATENT DOCUMENTS

| | | | | |
|---|---|---|---|---|
| 8,835,903 B2* | 9/2014 | Gwo | ................... | H01L 27/156 |
| | | | | 257/13 |
| 8,900,893 B2 | 12/2014 | Wang | | |
| 9,184,357 B2* | 11/2015 | Sugizaki | ................. | H01L 33/44 |
| 9,367,094 B2* | 6/2016 | Bibl | ...................... | G06F 3/0412 |
| 9,530,935 B2* | 12/2016 | Neumann | ........... | H01L 33/0079 |
| 9,666,764 B2* | 5/2017 | Bergmann | .............. | H01L 33/50 |
| 9,941,329 B2* | 4/2018 | Nayak | .................. | H01L 27/156 |
| 9,978,728 B2* | 5/2018 | Lin | ..................... | H01L 25/0753 |
| 2005/0056855 A1* | 3/2005 | Lin | ....................... | H01L 33/382 |
| | | | | 257/98 |
| 2008/0029761 A1* | 2/2008 | Peng | .................... | H01L 33/486 |
| | | | | 257/43 |
| 2010/0244059 A1* | 9/2010 | Iida | ........................ | H05K 1/181 |
| | | | | 257/88 |
| 2011/0198609 A1* | 8/2011 | Huang | .................. | H01L 33/382 |
| | | | | 257/76 |
| 2011/0254034 A1* | 10/2011 | Konsek | .................. | H01L 33/60 |
| | | | | 257/98 |
| 2011/0272729 A1 | 11/2011 | Kim et al. | | |
| 2012/0074441 A1* | 3/2012 | Seo | ....................... | H01L 27/153 |
| | | | | 257/91 |
| 2012/0112226 A1* | 5/2012 | Grolier | ................. | H01L 33/382 |
| | | | | 257/98 |
| 2013/0075268 A1* | 3/2013 | England | ................... | C25D 5/10 |
| | | | | 205/131 |
| 2015/0169011 A1* | 6/2015 | Bibl | ....................... | G06F 3/0412 |
| | | | | 345/175 |
| 2016/0218240 A1* | 7/2016 | Bouvier | ................. | H01L 33/005 |
| 2016/0300881 A1* | 10/2016 | Bouvier | ................. | H01L 27/153 |
| 2017/0141091 A1* | 5/2017 | Bibl | ....................... | H01L 25/167 |
| 2017/0213502 A1* | 7/2017 | Henry | ................... | H01L 25/0753 |
| 2017/0294424 A1* | 10/2017 | Jeong | .................... | H01L 25/167 |
| 2018/0211991 A1* | 7/2018 | Hsiang | ................... | H01L 27/15 |
| 2018/0247922 A1* | 8/2018 | Robin | .................... | H01L 25/167 |
| 2018/0254266 A1* | 9/2018 | Seif | ........................ | H01L 25/167 |

FOREIGN PATENT DOCUMENTS

| | | |
|---|---|---|
| TW | 201709559 | 3/2017 |
| WO | 2013017917 | 2/2013 |
| WO | 2016036667 | 3/2016 |

OTHER PUBLICATIONS

Taiwanese Office Action and Search Report in related TW Application No. 106120184, dated Apr. 29, 2019, 11 pages.

Taiwanese Office Action in related TW Application No. 106120184, dated Nov. 14, 2019, 5 pages.

* cited by examiner

MICRO-LED DISPLAY ASSEMBLY

FIELD OF THE INVENTION

The present disclosure relates to semiconductor structures and, more particularly, to a micro-LED display assembly and methods of manufacture.

BACKGROUND

Inorganic light emitting diodes (ILED) are light emitting diodes made from semiconductor material. It is possible to produce a variety of different colors using an ILED, including red, green, yellow and blue. In operation, the ILED emits light when a forward bias voltage is applied to a P-N junction of the semiconductor material.

LED devices for display systems require high pixel placement density on a large surface. However, conventional manufacturing methods for LEDs have a challenge to meet yield requirements, especially for larger display sizes. Also, higher costs are associated with next generation displays due to poor wafer area utilization. As to this latter point, the use of a single die for large LED displays and image sensor arrays leaves significant unused space around edges of the wafer in partial field areas.

SUMMARY

In an aspect of the disclosure, a structure comprises: an interposer; and a plurality of micro-LED arrays each of which comprise a plurality of through-vias connecting pixels of the plurality of micro-LED arrays to the interposer.

In an aspect of the disclosure, a structure, comprises: an interposer comprising a plurality of through vias; a plurality of micro-LED arrays each of which comprise a plurality through-vias connecting to each pixel of the plurality of micro-LED arrays; and a back-end of the line interposer comprising a wiring scheme which connects the through-vias of each of the pixels to the through vias of the interposer.

In an aspect of the disclosure, a method comprises: forming a plurality of through vias in a substrate connecting to pixels of micro-LED arrays; and connecting the pixels of each of a plurality of micro-LED arrays to a single interposer with the through vias aligned with connections of the interposer.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
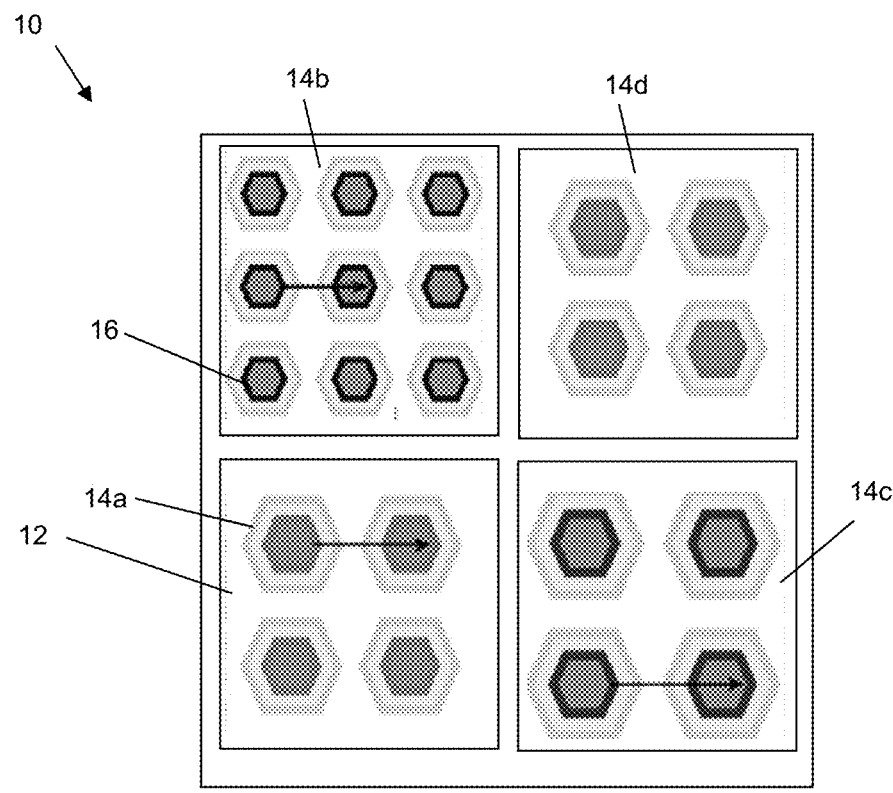
FIG. 1 shows a pixel design in accordance with aspects of the present disclosure.

The present disclosure relates to semiconductor structures and, more particularly, to a micro-LED display assembly and methods of manufacture. More specifically, the present disclosure relates to a micro-LED display assembly composed of multiple small micro-LED arrays placed in a larger array using through silicon via technologies. That is, the micro-LED display assembly uses multiple small dies in an array to replace one large array. The micro-LED display assembly can be used with, e.g., 2.5D and 3D technologies.

In embodiments, each small micro-LED array comprises through silicon via (TSV) technologies for mounting onto a substrate to form a larger display assembly. In embodiments, the TSVs are connected to each individual micro-LED, e.g., pixel. The TSV micro-LED array devices can be connected using a silicon or glass interposer, or directly to a pixel driver. In embodiments, the silicon interposer allows for direct integration of pixel driver circuits; whereas, the glass interposer would require a separate pixel driver. In embodiments, the multiple small micro-LED arrays provides high dense wiring to each TSV/micro-LED connection.

Advantageously, the micro-LED display assembly provides improved (e.g., high) yields for large display sizes, compared to using a single, larger pixel array. This is due to the fact that several small dies can be assembled to collectively form the larger LED array; instead of a single large die. More specifically, if a failure is found on a single large die, the entire die will need to be discarded; whereas, as presently disclosed herein, if a single failure is found on a smaller die, only that single, smaller die will need to be discarded. This will significantly reduce costs and improve yields, as it is less expensive to discard smaller dies than a larger die upon a failure of a pixel.

In addition, manufacturing costs can be significantly reduced by more efficiently using the space on the wafer. For example, by using smaller dies, it is now possible to more efficiently utilize the unused space around edges of the wafer. Moreover, the micro-LED display assembly described herein provides improved reliability by using an interposer which acts as a stress buffer between the board and the micro-LED dies.

The micro-LED display assembly of the present disclosure can be manufactured in a number of ways using a number of different tools. In general, though, the methodologies and tools are used to form structures with dimensions in the micrometer and nanometer scale. The methodologies, i.e., technologies, employed to manufacture the micro-LED display assembly of the present disclosure have been adopted from integrated circuit (IC) technology. For example, the micro-LED display assembly is built on wafers and are realized in films of material patterned by photolithographic processes on the top of a wafer. In particular, the fabrication of the wafer bond pad structures uses three basic building blocks: (i) deposition of thin films of material on a substrate, (ii) applying a patterned mask on top of the films by photolithographic imaging, and (iii) etching the films selectively to the mask.

FIG. 1 shows a single pixel used in a micro-LED assembly in accordance with aspects of the present disclosure. It should be understood by those of skill in the art that FIG. 1 (and other figures described herein) can also represent a layout pattern for any repeatable design structure such as memory cell arrays, etc. In FIG. 1, a pixel 10 comprises a contact plate or electrode 12 with four sub-pixels 14a-14d. In embodiments, the contact plate or electrode 12 can be a nano-wire contact and reflector plate composed of opaque material such as metal, for example, to maximize light emitting from the sub-pixels 14a-14d.

In embodiments, the pixel 10 has a dimension of 6.35 μm×6.35 μm and the sub-pixels 14a-14d have a dimension of 3.175 μm×3.175 μm; although other dimensions are also contemplated herein. As should be understood by those of skill in the art, multiple of these pixels 10 can be formed on a single micro-LED assembly in accordance with aspects of the present disclosure. For example, a micro-LED assembly implemented herein can include 1000 pixels by 1000 pixels; although other pixel counts are contemplated herein depending on the assembly technology or tools.

Still referring to FIG. 1, the sub-pixels 14a-14d comprise, in one illustrative example, a RGB pixel design used in an inorganic light emitting diode (ILED). In embodiments, each of the sub-pixels 14a-14d can have a different number of nano-wires 16 composed of different materials to emit a certain color, e.g., wavelength. By way of non-limiting example, (i) for green light, there can be four nano-wires 16 for sub-pixels 14a, 14d, (ii) for blue light, there can be nine nano-wires 16 for sub-pixel 14b, and (iii) for red light, there can be four nano-wires 16 for sub-pixel 14c. Although sub-pixel 14d is shown to be redundant to sub-pixel 14a, it should be understood that sub-pixel 14d can be redundant to any of the sub-pixels 14a-14c. Alternatively, sub-pixel 14d can be left empty, e.g., devoid of any nano-wires.

Although not critical to the understanding of the present disclosure, the nano-wires 16 can be composed of different materials in order to provide different wavelengths. For example, Table 1 below shows exemplary combinations of semiconductor materials that can be utilized for the nano-wires.

TABLE 1

| Color | Wavelength | Semiconductor Material |
|---|---|---|
| RED | $610 < \lambda < 760$ | Aluminum gallium arsenide (AlGaAs) |
| | | Gallium arsenide phosphide (GaAsP) |
| | | Aluminum gallium indium phosphide (AlGaInP) |
| | | Gallium(III) phosphide (GaP) |
| GREEN | $500 < \lambda < 570$ | Gallium(III) phosphide (GaP) |
| | | Aluminum gallium indium phosphide (AlGaInP) |
| | | Aluminum gallium phosphide (AlGaP) |
| | | Indium gallium nitride (InGaN)/ Gallium(III) nitride (GaN) |
| BLUE | $450 < \lambda < 500$ | Zinc selenide (ZnSe) |
| | | Indium gallium nitride (InGaN) |

Figure 2:
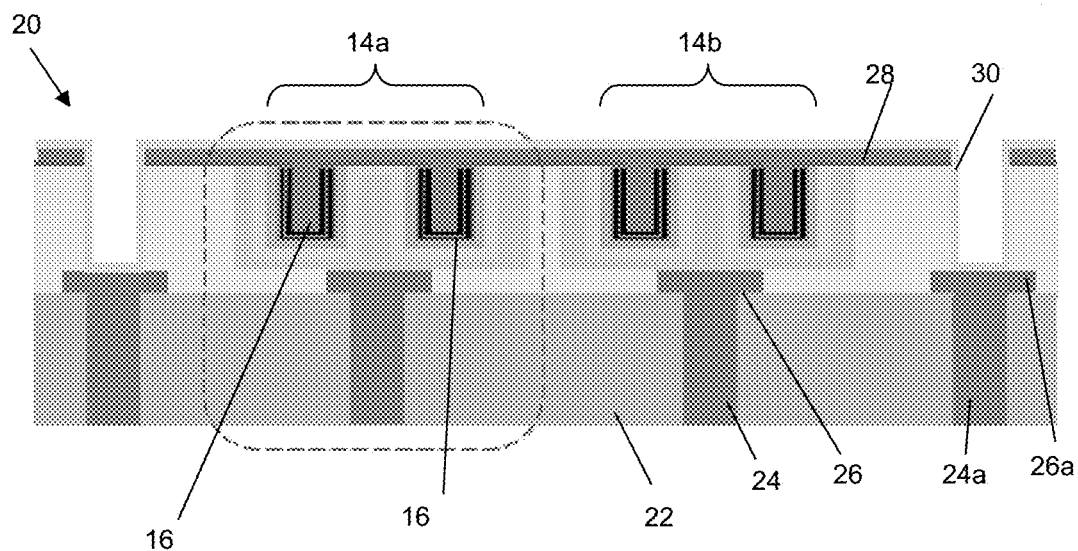
FIG. 2 shows a cross-sectional view of a micro-LED assembly and respective fabrication processes in accordance with an aspect of the present disclosure.

FIG. 2 shows a cross-sectional view of a micro-LED assembly and respective fabrication processes in accordance with an aspect of the present disclosure. As shown in FIG. 2, the micro-LED assembly 20 includes sub-pixels 14a, 14b, each having a plurality of nanowires 16. In the example shown, the cross-sectional view of the micro-LED assembly 20 shows sub-pixels 14a, 14b for each pixel 10a, 10b.

As further shown in FIG. 2, the micro-LED assembly 20 further includes a substrate 22 with a plurality of TSVs 24 connected to a metal pad 26, e.g., copper pad, in electrical connection with each of the pixels 10a, 10b (e.g., sub-pixels 14a, 14b). As shown, a single TSV 24 is used per pixel, with a diameter of the TSV 24 about ½ a pixel pitch. For example, in an illustrative embodiment, the TSV 24 can have a diameter/width of about less than 3 μm for a pixel that has a pitch of about 6 μm; although smaller dimensions are possible with thinner dies. In embodiments, the pad 26 can be in direct electrical communication with pGaN sub-pixels 14a, 14b, with all pixels sharing a blanket nGaN connection 28, or vice versa. In this representation, the pads 26a and TSVs 24a can be connected to a conductive terminal layer 30. In this way, it is not necessary to have a separate TSV or conductive terminal for each pixel.

Figure 3:
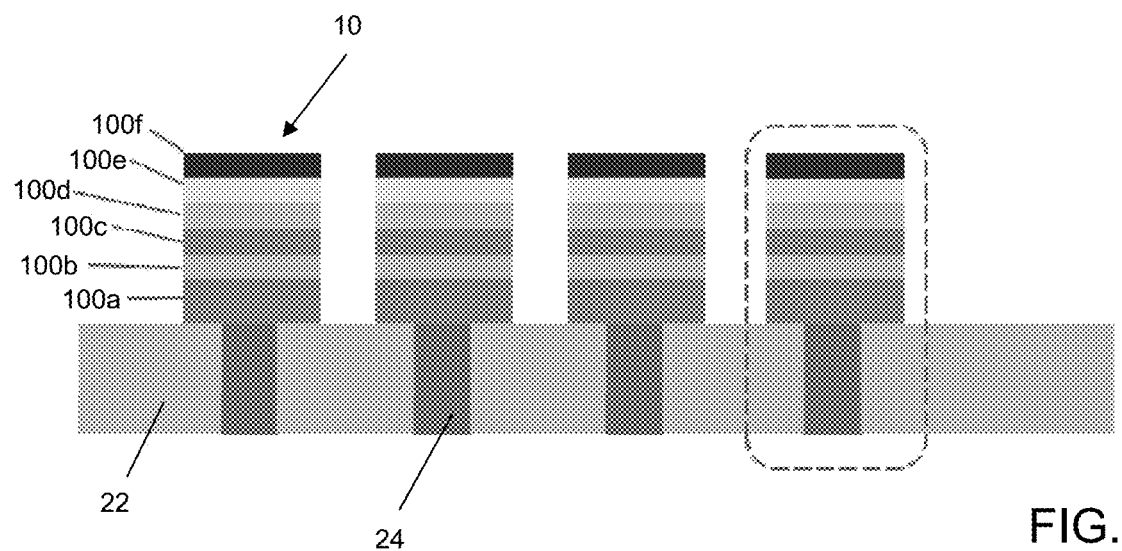
FIG. 3 shows an alternative structure and respective fabrication processes in accordance with aspects of the present disclosure.

FIG. 3 shows an alternative structure and respective fabrication processes in accordance with aspects of the present disclosure. In this structure, the pixels 10 are schematically represented as stacked structures composed of a plurality of layers 100a-100f, each of which are connected to a TSV 24 formed in the substrate 22. In embodiments, the layers include: nGaN 100a, InGaN 100b, pGaN 100c, a terminal layer 100d, a phosphorous layer 100e and a color filter 100f. It should be recognized that these layers are provided as illustrative examples and should not be considered limiting features of the present disclosure. For simplicity of illustration, the common pGaN terminal wired to separate TSVs is not shown.

In each of the representations of FIG. 2 and FIG. 3, the ILED wafer is formed separately, then bonded to the TSV carrier wafer (e.g., wafer 22). Also, the TSVs 24 can be formed by a conventional backside grinding process followed by a deep Si etch, e.g., Bosch etch, to form vias, aligned with and exposing the pads formed on the front side of the wafer (and which are in electrical contact with the pixels). The vias are then coated with dielectric liner, e.g., an inorganic material such as $SiO_2$. In embodiments, the dielectric liner would be deposited to a thickness of about 200 nm; although other thicknesses are contemplated herein. A barrier metal, e.g., Ta or TiN, can be formed over the dielectric liner to prevent Cu diffusion into the oxide and wafer. A seed layer can be sputtered onto the barrier metal, followed by an electroplating process, e.g., Cu electroplating process. Any residual material can be removed by a chemical mechanical polishing step. It should be understood that reference numeral 24 represents the different materials within the via, itself.

Figure 4:
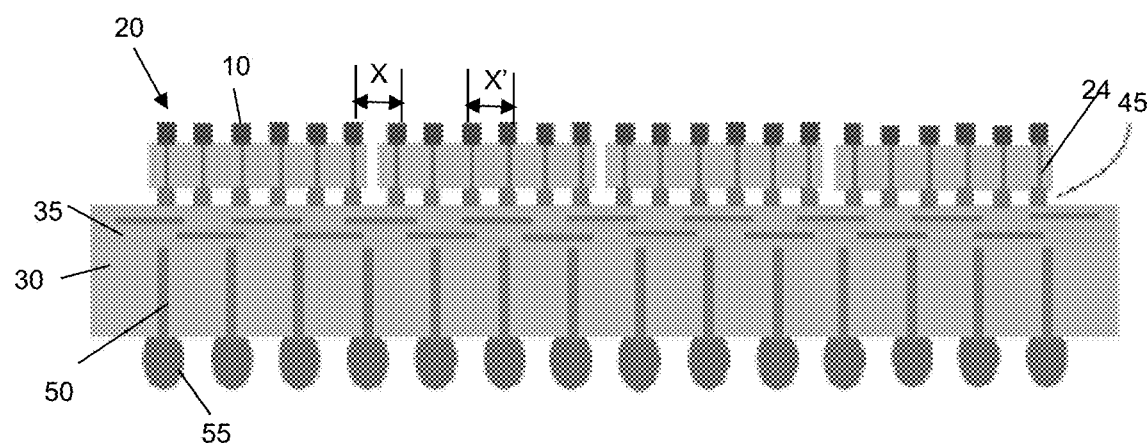
FIG. 4 shows a cross-sectional view of the micro-LED display assembly in accordance with aspects of the present disclosure.

FIG. 4 shows a cross-sectional view of the micro-LED display assembly in accordance with aspects of the present disclosure. More specifically, FIG. 4 shows a plurality of micro-LED assemblies 20 mounted on an interposer 30. In embodiments, the interposer 30 can be an Si interposer composed of integrated ILED pixel driver circuits. In alternative embodiments, the interposer 30 can be a glass interposer or an active die. In embodiments, the plurality of micro-LED assemblies 20, e.g., at least two ILED dies containing the TSV interconnects, are placed with equal spacing on the interposer 30 as further described herein.

A back end of the line (BEOL) wiring 35 is positioned (e.g., bonded) between the plurality of micro-LED assemblies 20 and the interposer 30. In embodiments, the BEOL wiring 35 includes a wiring scheme which electrically connects each of the pixels 10 of the plurality of micro-LED assemblies 20 to the interposer 30. More specifically, each of the TSVs 24 of each pixel of each micro-LED assembly 20 connects to a micropillar interconnect 45 which, in turn, connects to the wiring scheme of the BEOL wiring 35. In embodiments, the pitch of the micropillar interconnect 45 will match the TSVs 24, e.g., 5-10 μm pitch. As should be understood by those of skill in the art, the micropillar interconnect 45 can be a conventional controlled collapse chip connection (C4) solder interconnect. In alternate embodiments, the plurality of micro-LED assemblies 20 can be gang bonded to the BEOL wiring 35.

Still referring to FIG. 4, the wiring scheme of the BEOL wiring 35 is connected to a plurality of TSVs 50 of the interposer 30. The TSVs 50 of the interposer 30 can be manufactured in the same manner as the TSVs 24 for each pixel of the micro-LED assemblies 20. In connecting the plurality of TSVs 50 of the interposer 30, in embodiments, the across die pixel pitch/spacing "X" is preferably equal to the within die pixel pitch/spacing "X" so as not to disrupt viewing of the overall pixel array. In further embodiments, the interposer 30 includes solder connections 55 in electrical contact with the TSVs 50 of the interposer 30. In this way, the solder connections 55 provide external interconnects for the micro-LED assemblies 20.

Figure 5:
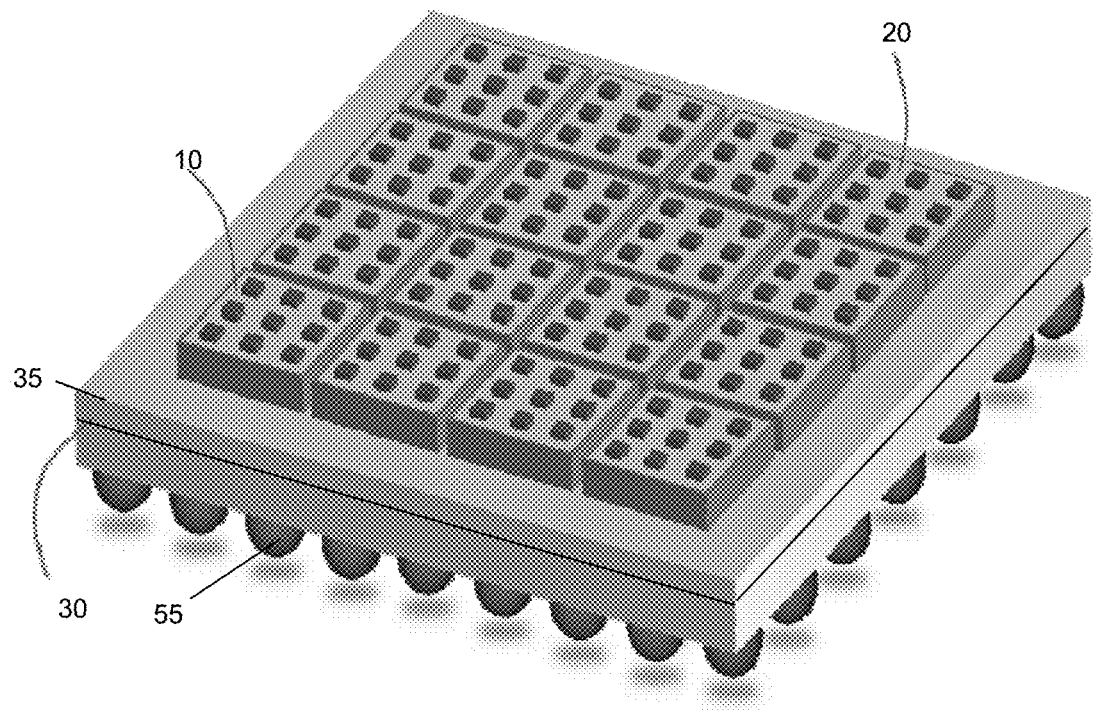
FIG. 5 shows a perspective view of the micro-LED display assembly in accordance with aspects of the present disclosure.

FIG. 5 shows a perspective view of the micro-LED display assembly in accordance with aspects of the present disclosure. More specifically, FIG. 5 shows a plurality of micro-LED assemblies 20 mounted on the interposer 30. In embodiments, the plurality of micro-LED assemblies 20, e.g., at least two ILED dies, each contain a plurality of LED pixels 10 with TSV interconnects, placed with equal spacing on the interposer 30. The BEOL interposer 35 is positioned between the plurality of micro-LED assemblies 20 and the interposer 30. The interposer 30 includes solder connections 55 to provide external interconnects for the micro-LED assemblies 20.

Figure 6:
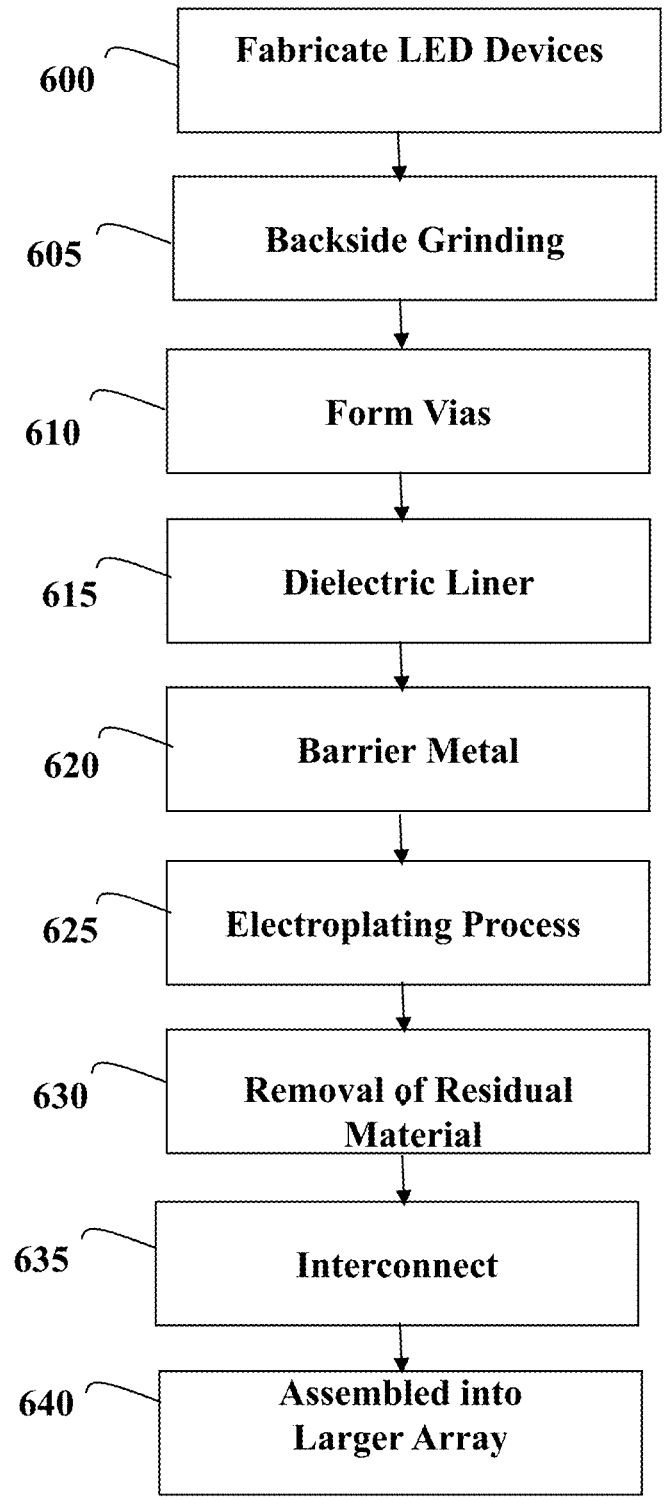
FIG. 6 shows a flowchart of the fabrication processes in accordance with aspects of the disclosure

FIG. 6 shows a flowchart of the fabrication processes in accordance with aspects of the disclosure. Particularly, to fabricate the structures shown in FIGS. 2-5, the LED devices, e.g., pixels 10, are fabricated on a wafer using conventional CMOS fabrication processes, at step 600. At step 605, the wafer is flipped over and a backside grinding process is performed. In embodiments, the backside grinding process can thin the wafer, e.g., Si, to about 50 microns. At step 610, a backside of the wafer then undergoes a deep Si etch, e.g., Bosch etch, to form vias, aligned with and exposing the pads formed on the front side of the wafer (and which are in electrical contact with the pixels). At step 615, a dielectric liner is formed in the vias. The dielectric liner can be, e.g., an organic spin on material (SiCOH) or a polyimide material. In embodiments, the dielectric liner would be deposited to a thickness of about 200 nm. At step 620, a barrier metal can be formed over the dielectric liner to prevent Cu diffusion into the oxide and wafer. In embodiments, the barrier metal can be Ta or TiN, deposited by a sputter chemical vapor deposition process. At step 625, an electroplating process is performed. For example, a seed layer is sputtered onto the barrier metal, followed by filling of the via with an electroplating process, e.g., Cu electroplating process. At step 630, any residual material can be removed from the backside surface of the wafer by a chemical mechanical polishing (CMP) process. At step 635, an interconnect can be formed in direct electrical connection to the metal material of the TSV. At step 640, the micro-LED arrays can be assembled into a larger array by connecting each of the micro-LED arrays to an interposer, as an example.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
an interposer;
a plurality of light emitting diode (LED) arrays each of which comprise a plurality of pixels composed of multiple sub-pixels;
a plurality of through-vias composed of an insulator liner, diffusion barrier metal and electroplated metallization feature, each through via of the plurality of through-vias being directly below and connecting to each pixel of the plurality of pixels of each of the plurality of LED arrays by a metal pad that is in physical contact and directly below the each pixel, wherein each through via of the plurality of through vias is further connected to the interposer and a single through via is used per pixel; and
a horizontal plate composed of GaN, wherein the plurality of pixels share the horizontal plate composed of GaN from above the plurality of pixels.

2. The structure of claim 1, wherein the interposer is a silicon interposer with driver circuits.

3. The structure of claim 1, wherein the interposer is a glass interposer.

4. The structure of claim 1, wherein the through-vias are through silicon vias.

5. The structure of claim 4, wherein each of the pixels is connected to the interposer by a separate one of the through silicon vias.

6. The structure of claim 1, wherein the pixels are composed of GaN and the through-vias are copper through silicon vias integrated into a same die as the pixels.

7. The structure of claim 1, wherein the through-vias are connected to the interposer by pillars which match a pitch of the through-vias.

8. The structure of claim 1, wherein the plurality of LED arrays are equally spaced apart on the interposer.

9. The structure of claim 8, wherein an across die pixel pitch is equal to a pixel pitch within each of the plurality of LED arrays.

10. The structure of claim 1, wherein a diameter of the through vias is about ½ a pixel pitch.

11. The structure of claim 1, further comprising a back-end of the line wiring scheme which is interposed between the interposer and the plurality of LED arrays, the back-end of the line wiring scheme connects the each of the plurality of through-vias of each of the pixels to the interposer by separate pillars aligned with each of the plurality of through-vias of each of the pixels.

12. A structure comprising:

an interposer comprising a plurality of through vias;

a plurality of light emitting diode (LED) arrays each of which comprises a plurality of pixels, a plurality of through-vias composed of an insulator liner, a barrier metal and electroplated metallization feature and each one of the plurality of through vias being directly below and connecting a separate pixel of the plurality of pixels by a metal pad that is directly below and in physical contact with the separate pixel, and wherein each pixel of the plurality of pixels is composed of multiple sub-pixels;

a back-end of the line wiring scheme which is positioned between and connected to the interposer and the plurality of LED arrays by a plurality of pillars, wherein each pillar of the plurality of pillars is aligned with and connects to the separate pixel of the plurality of pixels by a respective one of the plurality of through-vias such that only a single pillar the single pixel, respectively; and a horizontal plate composed of GaN, wherein the plurality of pixels share the horizontal plate composed of GaN from above the plurality of pixels.

13. The structure of claim 12, wherein:

the plurality of LED arrays are equally spaced apart; and an across die pixel pitch is equal to a pixel pitch within each of the plurality of -LED arrays.

14. The structure of claim 13, wherein the pixels are composed of GaN and the through-vias of the plurality of the plurality of LED arrays are copper through silicon vias integrated into a same die as the pixels.

15. The structure of claim 14, wherein the through silicon vias are connected to the back end of the-line wiring scheme by the pillars.

16. The structure of claim 15, wherein the pillars are solder connections.

17. The structure of claim 15, wherein the pillars match a pitch of the through silicon vias.

18. The structure of claim 14, wherein a diameter of each through-via is about ½ a pixel pitch.

19. The structure of claim 12, wherein the back-end of the line interposer is a silicon interposer with driver circuits.

20. The structure of claim 12, wherein the back-end of the line interposer is a glass interposer.

\* \* \* \* \*